(12) United States Patent
Yu

(10) Patent No.: US 10,158,100 B2
(45) Date of Patent: *Dec. 18, 2018

(54) METHOD FOR MANUFACTURING FLEXIBLE DISPLAY PANEL AND FLEXIBLE DISPLAY PANEL

(71) Applicant: Shenzhen China Star Optoelectronics Technology Co., Ltd., Shenzhen, Guangdong (CN)

(72) Inventor: Wei Yu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/822,144

(22) Filed: Nov. 25, 2017

(65) Prior Publication Data

US 2018/0076420 A1 Mar. 15, 2018

Related U.S. Application Data

(63) Continuation of application No. 14/773,427, filed on Sep. 8, 2015, now Pat. No. 9,935,297.

(51) Int. Cl.
*H01L 51/56* (2006.01)
*H01L 27/32* (2006.01)
*H01L 51/52* (2006.01)
*H01L 51/00* (2006.01)

(52) U.S. Cl.
CPC .............. *H01L 51/56* (2013.01); *H01L 27/32* (2013.01); *H01L 51/003* (2013.01); *H01L 51/0097* (2013.01); *H01L 51/5237* (2013.01); *H01L 51/5246* (2013.01); *H01L 2251/566* (2013.01); *Y02E 10/549* (2013.01)

(58) Field of Classification Search
CPC ......... H01L 51/56; H01L 51/00; H01L 51/52; H01L 27/12; H01L 27/32; H01L 21/70
USPC ........... 438/28, 455, 458, 459; 457/E27.011, 457/E29.295
See application file for complete search history.

(56) References Cited

U.S. PATENT DOCUMENTS

| | | | |
|---|---|---|---|
| 6,274,887 B1 * | 8/2001 | Yamazaki | H01L 27/12 257/204 |
| 6,445,005 B1 * | 9/2002 | Yamazaki | H01L 27/322 257/59 |
| 2002/0125817 A1 * | 9/2002 | Yamazaki | H05B 33/04 313/498 |
| 2002/0158577 A1 * | 10/2002 | Shimoda | H01L 27/3253 313/506 |

(Continued)

*Primary Examiner* — Sheikh Maruf
(74) *Attorney, Agent, or Firm* — Andrew C. Cheng

(57) ABSTRACT

A method for manufacturing a flexible display panel includes: binding a flexible substrate with a supporting column matrix on a supporting plate, and fixing the flexible substrate with the supporting plate by a sealant in vacuum, wherein the sealant is disposed at an edge of the supporting column matrix, such that the supporting column matrix is surrounded in a sealed space formed by the sealant, the supporting plate and the flexible substrate; forming a flexible display panel on the flexible substrate; and cutting the supporting plate and the flexible display panel along the inner side of the sealant, such that the flexible display panel separating with the supporting plate. Thus, the flexible substrate can be separated from the supporting plate without damaging devices disposed on the flexible substrate.

6 Claims, 2 Drawing Sheets

(56) References Cited

U.S. PATENT DOCUMENTS

| | | | | |
|---|---|---|---|---|
| 2003/0027369 A1* | 2/2003 | Yamazaki | H01L 51/003 | 438/21 |
| 2003/0034497 A1* | 2/2003 | Yamazaki | H01L 27/3244 | 257/86 |
| 2003/0057422 A1* | 3/2003 | Yamazaki | H01L 21/6835 | 257/79 |
| 2003/0206332 A1* | 11/2003 | Yamazaki | H01L 51/5253 | 359/312 |
| 2006/0021671 A1* | 2/2006 | Watanabe | G02F 1/133351 | 141/8 |
| 2009/0061721 A1* | 3/2009 | Isa | H01L 27/1214 | 445/24 |
| 2009/0124062 A1* | 5/2009 | Yamazaki | G02F 1/133305 | 438/457 |
| 2009/0147167 A1* | 6/2009 | Park | G02F 1/134363 | 349/40 |
| 2010/0279576 A1* | 11/2010 | Kim | G02F 1/1303 | 445/25 |
| 2010/0279578 A1* | 11/2010 | Matsuzaki | H01L 51/5259 | 445/25 |
| 2011/0192525 A1* | 8/2011 | Kondo | B30B 5/02 | 156/99 |
| 2013/0072079 A1* | 3/2013 | Tang | G02F 1/133351 | 445/24 |
| 2013/0169908 A1* | 7/2013 | Iwamoto | G02F 1/133707 | 349/96 |
| 2014/0065916 A1* | 3/2014 | Lee | H01L 51/003 | 445/25 |
| 2014/0306288 A1* | 10/2014 | Adachi | H01L 27/1218 | 257/347 |
| 2015/0349297 A1* | 12/2015 | Horiguchi | H01L 51/5253 | 438/28 |
| 2016/0190512 A1* | 6/2016 | Chida | H01L 51/003 | 257/40 |

* cited by examiner

METHOD FOR MANUFACTURING FLEXIBLE DISPLAY PANEL AND FLEXIBLE DISPLAY PANEL

CROSS REFERENCE TO RELATED APPLICATIONS

This is a continuation application of co-pending patent application Ser. No. 14/773,427, filed on Sep. 8, 2015, which is a national stage of PCT Application Number PCT/CN2015/084815, filed on Jul. 22, 2015, claiming foreign priority of Chinese Patent Application Number 201510377037.0, filed on Jul. 1, 2015.

TECHNICAL FIELD

The disclosure is related to the field of display, and more particularly to a method for manufacturing a flexible display panel and a flexible display panel.

RELATED ART

At present, organic light-emitting diode (OLED) displays have become novel panel displays, and are widely used in different display products, such as mobile phones and televisions. Since OLED displays are self-luminous, additional backlight modules are not necessary. Thus, OLED displays can be flexible.

Since flexible substrates are flexible, in the present process of manufacturing OLED flexible panels, the flexible substrates have to be attached to supporting plates by sealants, and then further processes are performed on the flexible substrates; after the processes are performed on the flexible substrates, the flexible substrates are separated from the supporting plates so as to obtain the flexible OLED panels.

However, since the flexible substrates are completely attached to the supporting plates, the flexible substrates may be bent during the stripping process, such that the devices on the flexible OLED panels are damaged and the devices fail.

SUMMARY

The disclosure provides a method for manufacturing a flexible display panel and a flexible display panel, such that the flexible substrate can be separated from the supporting plate without damaging devices disposed on the flexible substrate.

According to the first aspect of the disclosure, a method for manufacturing a flexible display panel is provided. The method comprises: binding a flexible substrate with a supporting column matrix on a supporting plate, and fixing the flexible substrate with the supporting plate by a sealant in vacuum, wherein the sealant is disposed at the edge of the supporting column matrix, such that the supporting column matrix is surrounded in a sealed space formed by the sealant, the supporting plate and the flexible substrate; forming a flexible display panel on the flexible substrate; and cutting the supporting plate and the flexible display panel along the inner side of the sealant, such that the flexible display panel separating with the supporting plate.

Wherein before the step of binding a flexible substrate with a supporting column matrix on a supporting plate, and fixing the flexible substrate with the supporting plate by a sealant in vacuum, the method further comprises: forming a thin film on the supporting plate; exposing the film, developing the film, baking the film and etching the film, alternatively, exposing the film, developing the film and baking the film, and obtaining the supporting column matrix formed by the thin film; and coating the sealant at the edge of the supporting plate.

Wherein the material of the thin film is silicon nitride SiNx, black matrix BM or photo spacer PS.

Wherein before the step of binding a flexible substrate with a supporting column matrix on a supporting plate, and fixing the flexible substrate with the supporting plate by a sealant in vacuum, the method further comprises: coating a photoresist on a surface of the supporting plate; exposing the surface of the supporting plate, developing the surface of the supporting plate and etching surface of the supporting plate, and obtaining the supporting column matrix formed by the supporting plate; and coating the sealant at the etched region of the edge of the supporting plate.

Wherein the height of the sealant coated at the supporting plate is higher than or equal to the height of the supporting column matrix.

Wherein the sealant is an UV sealant, and the step of fixing the flexible substrate with the supporting plate by a sealant comprises: curing the sealant between the flexible substrate and the supporting plate by an ultraviolet.

Wherein the step of forming a flexible display panel on the flexible substrate comprises: manufacturing an OLED on the surface of the flexible substrate, and packaging the OLED device so as to obtain the flexible display panel.

Wherein the step of cutting the supporting plate and the flexible display panel along the inner side of the sealant, such that the flexible display panel separating with the supporting plate comprises: cutting the supporting plate along the inner side of the sealant, such that the flexible display panel separating with the supporting plate; and cutting the sealant disposed at the edge of the flexible display panel.

Wherein the supporting plate is a glass substrate and/or the flexible substrate is a plastic substrate.

According to the second aspect of the disclosure, a method for manufacturing a flexible display panel is provided. The method comprises: forming a thin film on a supporting plate, exposing the film, developing the film, baking the film and etching the film, alternatively, exposing the film, developing the film and baking the film, and obtaining a supporting column matrix formed by the thin film; alternatively, coating a photoresist on a surface of the supporting plate, exposing the surface of the supporting plate, developing the surface of the supporting plate and etching surface of the supporting plate, and obtaining a supporting column matrix formed by the supporting plate; coating a sealant at the edge of the supporting plate, wherein the sealant is an ultraviolet sealant; binding a flexible substrate with the supporting column matrix on the supporting plate, curing the sealant between the flexible substrate and the supporting plate by an ultraviolet in vacuum, wherein the sealant is disposed at the edge of the supporting column matrix, such that the supporting column matrix is surrounded in a sealed space formed by the sealant, the supporting plate and the flexible substrate; forming a flexible display panel on the flexible substrate; and cutting the supporting plate and the flexible display panel along the inner side of the sealant, such that the flexible display panel separating with the supporting plate.

Wherein the material of the thin film is silicon nitride SiNx, black matrix BM or photo spacer PS.

Wherein the height of the sealant coated at the supporting plate is higher than or equal to the height of the supporting column matrix.

Wherein the step of forming a flexible display panel on the flexible substrate comprises: manufacturing an OLED on the surface of the flexible substrate, and packaging the OLED device so as to obtain the flexible display panel.

Wherein the step of cutting the supporting plate and the flexible display panel along the inner side of the sealant, such that the flexible display panel separating with the supporting plate comprises: cutting the supporting plate along the inner side of the sealant, such that the flexible display panel separating with the supporting plate; and cutting the sealant disposed at the edge of the flexible display panel.

Wherein the supporting plate is a glass substrate and/or the flexible substrate is a plastic substrate.

According to the third aspect of the disclosure, a flexible display panel is provided.

Wherein the flexible display panel is manufacture by the method described above.

According to the embodiments of the disclosure, a supporting column matrix is disposed on the supporting plate for supporting the flexible substrate, the flexible panel is bound on the supporting column matrix, as well as the flexible substrates is fixed on the supporting plate by the sealant, such that a vacuum layer is formed between the flexible substrate and the supporting plate. Since the vacuum layer has a strong attractive force, the flexible substrate and the supporting plate can be tightly fixed, such that the flexible substrate would not protrude during the manufacturing process. In addition, after forming the flexible display panel on the flexible substrate, the flexible display panel and the supporting plate are cut along the inner side of the sealant, and the flexible display panel would be separated automatically without damaging the devices disposed on the flexible display panels.

BRIEF DESCRIPTION OF THE DRAWINGS

In order to more clearly illustrate the embodiments of the disclosure, the accompanying drawings for illustrating the technical solutions and the technical solutions of the disclosure are briefly described as below.

DETAILED DESCRIPTION

The following description with reference to the accompanying drawings is provided to clearly and completely explain the exemplary embodiments of the disclosure. It is apparent that the following embodiments are merely some embodiments of the disclosure rather than all embodiments of the disclosure. According to the embodiments in the disclosure, all the other embodiments attainable by those skilled in the art without creative endeavor belong to the protection scope of the disclosure.

Figure 1:
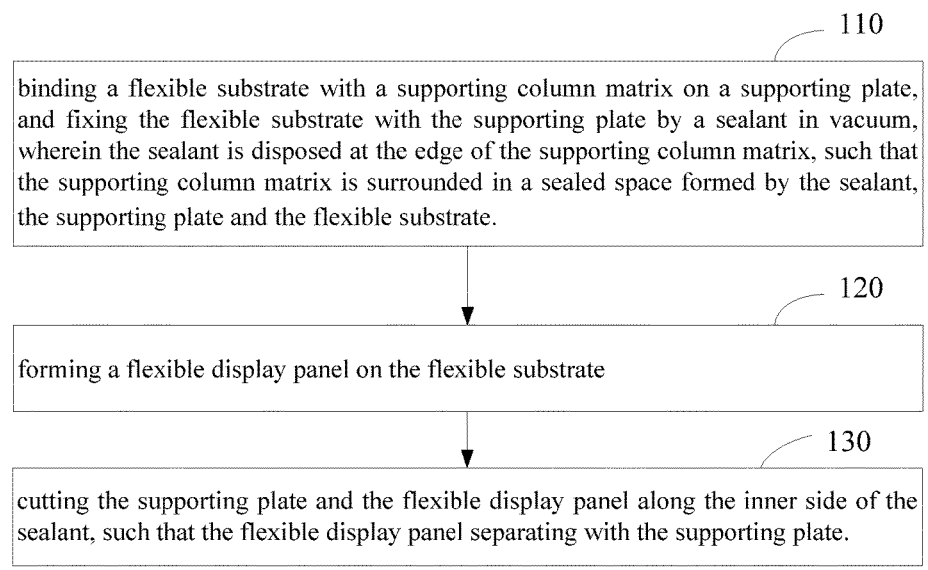
FIG. 1 is a flow chart of the method for manufacturing a flexible display panel according to an embodiment the disclosure.
Figure 2:
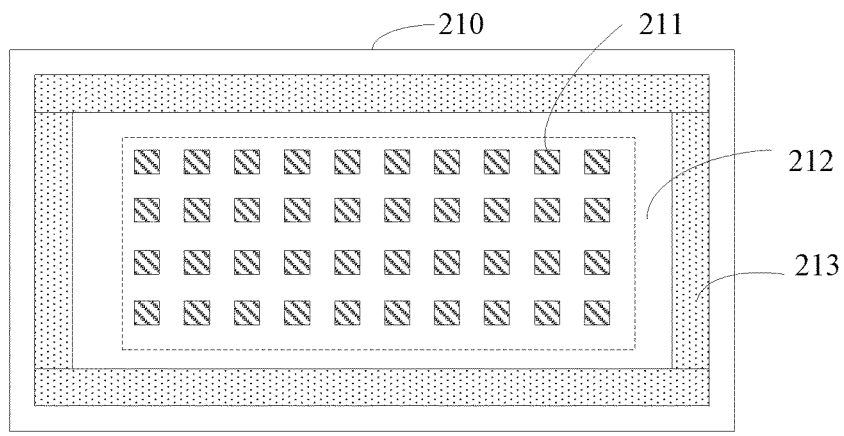
FIG. 2 is a top view of the supporting plate in Step 110 in FIG. 1.
Figure 3:
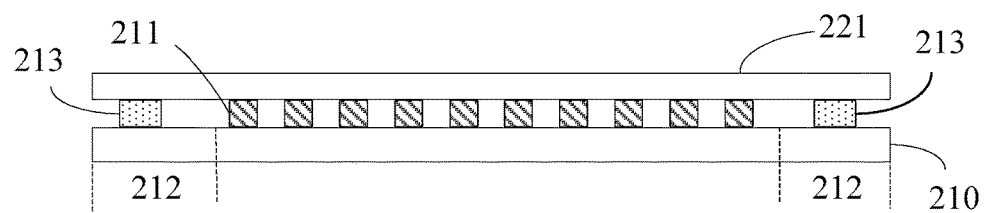
FIG. 3 is a side view of the supporting plate and the flexible substrate in Step 110 in FIG. 1.
Figure 4:
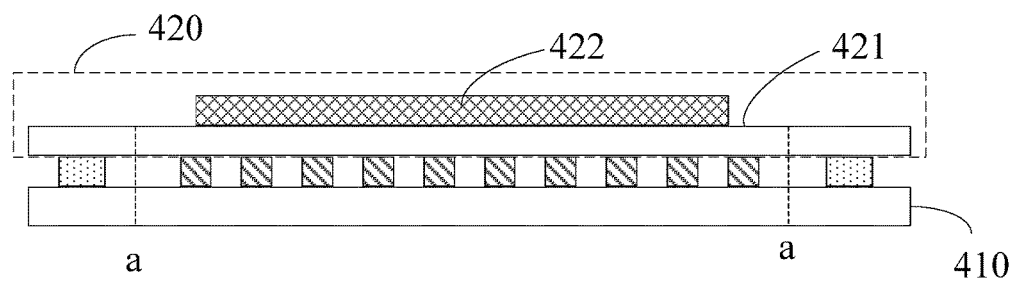
FIG. 4 is a side view of the supporting plate and the flexible display panel in Step 120 in FIG. 1.

Referring to FIGS. 1-4, FIG. 1 is a flow chart of the method for manufacturing a flexible display panel according to an embodiment the disclosure; FIG. 2 is a top view of the supporting plate in Step 110 in FIG. 1; FIG. 3 is a side view of the supporting plate and the flexible substrate in Step 110 in FIG. 1; and FIG. 4 is a side view of the supporting plate and the flexible display panel in Step 120 in FIG. 1. According to the embodiments of the disclosure, the flexible display panel is obtained by disposing a display device on the flexible substrate. The display device can be an OLED device so as to form a flexible OLED display panel. However, the disclosure is not limited thereto. In some other embodiments, the display device can be other types of devices, such as LED devices. The method for manufacturing a flexible display panel comprises:

Step 110: binding a flexible substrate with a supporting column matrix on a supporting plate, and fixing the flexible substrate with the supporting plate by a sealant in vacuum, wherein the sealant is disposed at the edge of the supporting column matrix, such that the supporting column matrix is surrounded in a sealed space formed by the sealant, the supporting plate and the flexible substrate.

Since the flexible substrate can be easily bent, to dispose the display device on the flexible substrate, the flexible substrate is firstly fixed on a supporting plate, such that the process of disposing the display device can be performed on the flexible substrate.

As shown in FIGS. 2 and 3, in this embodiment, a supporting column matrix is disposed on a surface of the supporting plate 210, such that a supporting force can be provided to the flexible substrate 221. The supporting column matrix is composed of a plurality of supporting columns 211 disposed with intervals therebetween. The cross section of the supporting column can be a square, a circle or other shapes, and the disclosure is not limited thereto. In addition, supporting columns are not disposed at the edge 212 of the supporting plate, which is configured for disposing a sealant 213. The width of the edge can be 10-50 mm, and preferably 20 mm.

In this embodiment, the supporting column matrix of the supporting plate having the structure described above is bound with the flexible substrate, and the flexible substrate is fixed with the supporting plate by the sealant in vacuum. The sealant is disposed at the edge of the supporting column matrix, i.e. the edge of the supporting plate, such that the supporting column matrix is surrounded in a sealed space formed by the sealant, the supporting plate and the flexible substrate. Thus, the flexible substrate can be firmly fixed by the vacuum region, which is at the edge, between the sealant and the supporting plate.

Optionally, the sealant can be an ultraviolet (UV) sealant. The step of fixing the flexible substrate with the supporting plate by a sealant comprises: curing the sealant between the flexible substrate and the supporting plate by an ultraviolet.

Optionally, the flexible substrate can be a plastic substrates formed of polyethylene naphthalate (PEN) or polyethylene terephthalate (PET). The material of the supporting plate can be any rigid materials, such as a glass plate.

Step 120: forming a flexible display panel on the flexible substrate.

As shown in FIG. 4, after the flexible substrate 421 is fixed on the supporting plate 410, the flexible substrate is supported by the supporting column matrix, such that it can avoid from being bent when bearing a force. A process of manufacturing a display device 422, such as an OLED device, can be performed on the flexible substrate 421. The OLED device is packaged, such that the flexible display panel 420 is formed.

Step 130: cutting the supporting plate and the flexible display panel along the inner side of the sealant, such that the flexible display panel separating with the supporting plate.

In this embodiment, the supporting plate and the flexible display panel, which are fixed by the sealant, are cut along the inner side (the dashed line "a" in FIG. 4) of the sealant. Since the sealant is cut, the supporting plate and the flexible display panel are not fixed with each other anymore, as well the vacuum region between the supporting plate and the flexible display panel is destroyed. Thus, the flexible substrate would be separated automatically, and stripping processes are not needed.

The supporting plate and the flexible display panel can be cut along the inner side of the sealant at the same time, or they can be cut respectively. For example, the supporting plate is cut along the inner side of the sealant, such that the flexible display panel is separated; the sealant at the edge of the flexible display panel is cut.

In the above-described embodiments, the supporting column matrix on the supporting plate can be preformed or formed when the flexible display panel is being manufactured. The supporting column matrix can be obtained by an additional thin film or by performing an etching process or a yellow light manufacturing process to the supporting plate.

According to another embodiment, before Step 110 of the method for manufacturing a flexible display panel, the method further comprises:

forming a thin film on the supporting plate;

exposing the film, developing the film, baking the film and etching the film, or alternatively, exposing the film, developing the film and baking the film, and obtaining the supporting column matrix formed by the thin film; and coating the sealant at the edge of the supporting plate.

In the process, the material of the thin film is silicon nitride (SiNx), black matrix (BM) or photo spacer (PS).

According to another embodiment, before Step 110 of the method for manufacturing a flexible display panel, the method further comprises:

coating a photoresist on a surface of the supporting plate;

exposing the surface of the supporting plate, developing the surface of the supporting plate and etching surface of the supporting plate, and obtaining the supporting column matrix formed by the supporting plate; and coating the sealant at the etched region of the edge of the supporting plate.

It can be realized that in the above embodiments the height of the sealant coated at the supporting plate is higher than or equal to the height of the supporting column matrix. Thus, it can be ensured that a sealed space can be formed by the supporting plate, the flexible substrate and the sealant after the supporting column matrix is bonded to the flexible substrate.

In some other embodiments, the sealant is not coated on the supporting plate. Instead, the sealant is coated on the edge of the flexible substrate. Then, the flexible substrate coated with the sealant is bonded to the supporting column matrix of the supporting plate and is fixed by the sealant.

According to another embodiment of the disclosure, a flexible display panel is provided. The flexible display panel comprises a flexible substrate and a display device disposed on the flexible substrate, such as an OLED device. The flexible display panel is manufacture by the method described above.

According to the embodiments of the disclosure, a supporting column matrix is disposed on the supporting plate for supporting the flexible substrate, the flexible panel is bound on the supporting column matrix, as well as the flexible substrates is fixed on the supporting plate by the sealant, such that a vacuum layer is formed between the flexible substrate and the supporting plate. Since the vacuum layer has a strong attractive force, the flexible substrate and the supporting plate can be tightly fixed, such that the flexible substrate would not protrude during the manufacturing process. In addition, after forming the flexible display panel on the flexible substrate, the flexible display panel and the supporting plate are cut along the inner side of the sealant, and the flexible display panel would be separated automatically without damaging the devices disposed on the flexible display panels.

It is noted that the specifications relating to the above embodiments should be construed as exemplary rather than as limitative of the present disclosure. The equivalent variations and modifications on the structures or the process by reference to the specification and the drawings of the disclosure, or application to the other relevant technology fields directly or indirectly should be construed similarly as falling within the protection scope of the disclosure.

What is claimed is:

1. A method for manufacturing a flexible display panel, comprising the steps of:
   (1) under a vacuum environment, attaching a flexible substrate with a sealant to a supporting plate having a supporting column matrix formed in a central supporting area of the supporting plate by a processes of exposing, developing, baking and etching a thin film formed on the central supporting area, wherein the flexible substrate has edges that are in contact with the sealant that is coated on edges of the supporting plate, the flexible substrate having a central portion in close contact with and supported by the supporting column matrix by vacuum created between the flexible substrate and the supporting plate;
   (2) curing the sealant located between the flexible substrate and the supporting plate by ultraviolet light;
   (3) forming a flexible display panel on the flexible substrate; and
   (4) separating the supporting plate from the flexible display panel along an inner side of the sealant such that the flexible display panel is separated from the supporting plate;
   wherein the sealant coated on edges of the supporting plate has a height that is higher than a height of the supporting column matrix.

2. The method according to claim 1, wherein Step (4) of separating the supporting plate from the flexible display panel along an inner side of the sealant, such that the flexible display panel is separated from the supporting plate, comprises:
   cutting the supporting plate along the inner side of the sealant, such that the flexible display panel is separated from the supporting plate; and
   cutting the sealant disposed at edges of the flexible display panel.

3. The method according to claim 1, wherein the thin film is formed of a material comprising one of silicon nitride (SiNx), black matrix (BM), photo spacer (PS), and photoresist.

4. The method according to claim 1, wherein Step (3) of forming a flexible display panel on the flexible substrate comprises: manufacturing an organic light emitting diode (OLED) device on a surface of the flexible substrate and packaging the OLED device so as to obtain a flexible display panel.

5. The method according to claim 1, wherein the supporting plate comprises a glass plate and the flexible substrate comprises a plastic plate.

6. A flexible display panel, wherein the flexible display panel is manufactured by the method according to claim 1.

* * * * *